United States Patent
Chubin et al.

(10) Patent No.: US 7,489,013 B1
(45) Date of Patent: Feb. 10, 2009

(54) DESTRUCTOR INTEGRATED CIRCUIT CHIP, INTERPOSER ELECTRONIC DEVICE AND METHODS

(75) Inventors: David E. Chubin, Northridge, CA (US);
Cuong V. Pham, San Diego, CA (US);
Colleen L. Khalifa, Perris, CA (US);
Randall David Buller, Northridge, CA (US)

(73) Assignee: Teledyne Technologies Incorporated, Thousand Oaks, CA (US)

( * ) Notice: Subject to any disclaimer, the term of this patent is extended or adjusted under 35 U.S.C. 154(b) by 0 days.

(21) Appl. No.: 11/252,403

(22) Filed: Oct. 17, 2005

(51) Int. Cl.
*H01L 23/06* (2006.01)
(52) U.S. Cl. .................. 257/417; 257/684; 257/922
(58) Field of Classification Search .................. 257/415, 257/417, 684, 922
See application file for complete search history.

(56) References Cited

U.S. PATENT DOCUMENTS

| | | | |
|---|---|---|---|
| 3,725,671 A * | 4/1973 | Keister et al. ............... 327/525 |
| 3,860,835 A * | 1/1975 | Brymer et al. ............... 327/525 |
| 4,962,415 A * | 10/1990 | Yamamoto et al. .......... 257/679 |
| 5,027,397 A | 6/1991 | Double et al. |
| 5,233,505 A | 8/1993 | Chang et al. |
| 5,858,500 A | 1/1999 | MacPherson |
| 6,201,707 B1 * | 3/2001 | Sota ........................... 361/761 |
| 6,524,462 B1 | 2/2003 | Lowe |
| 6,930,023 B2 | 8/2005 | Okada et al. |
| 2004/0244889 A1 | 12/2004 | Sailor et al. |

FOREIGN PATENT DOCUMENTS

DE  10252329 A1  5/2004

OTHER PUBLICATIONS

U.S. Appl. No. 11/043,626, filed Jan. 25, 2005.
Office Action issued on Mar. 11, 2008 in U.S. Appl. No. 11/043,626.
Office Action issued on Mar. 27, 2008 in U.S. Appl. No. 11/252,402.
Office Action issued on Mar. 5, 2007 in U.S. Appl. No. 11/043,626.
Office Action issued on Jun. 26, 2007 in U.S. Appl. No. 11/043,626.
U.S. Appl. No. 11/252,402, filed Oct. 18, 2005.
Office Action issued on Oct. 9, 2007 in U.S. Appl. No. 11/252,402.
U.S. Appl. No. 11/944,771, filed Nov. 26, 2007.
D3 Tamper Respondent Systems Product Brochure, 2001, 6 pages.
D3 Technology Tamper Respondent Sensors and Enclosures, W.L. Gore & Associates (UK) Ltd. Dundee Technology Park, Dundee DD2 1JA, Scotland, 2 pages.

* cited by examiner

*Primary Examiner*—Leonardo Andújar

(57) ABSTRACT

A semiconductor device. The device includes a substrate and an integrated circuit chip. The device also includes an electrically or thermally reactive layer located between a top surface of the substrate and a bottom surface of the integrated circuit chip, wherein the reactive layer is positioned such that detection of tampering causes the reactive layer to be electrically or thermally energized such that the semiconductor device is at least partially destroyed.

37 Claims, 1 Drawing Sheet

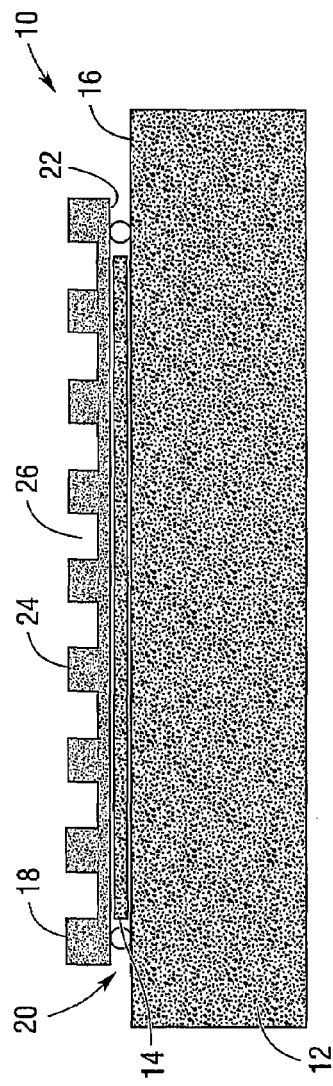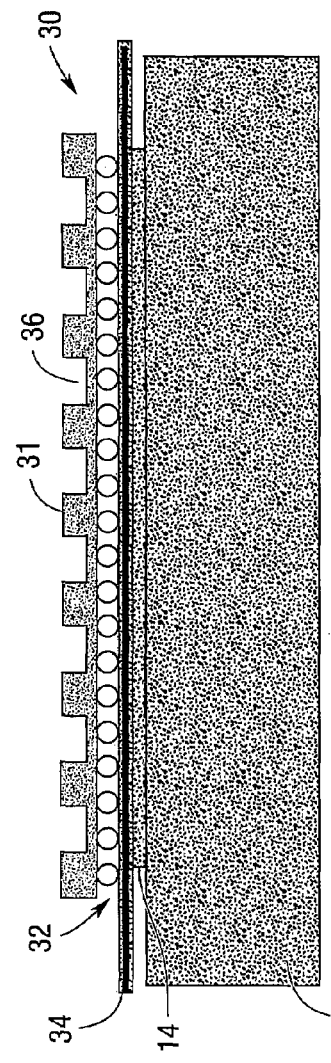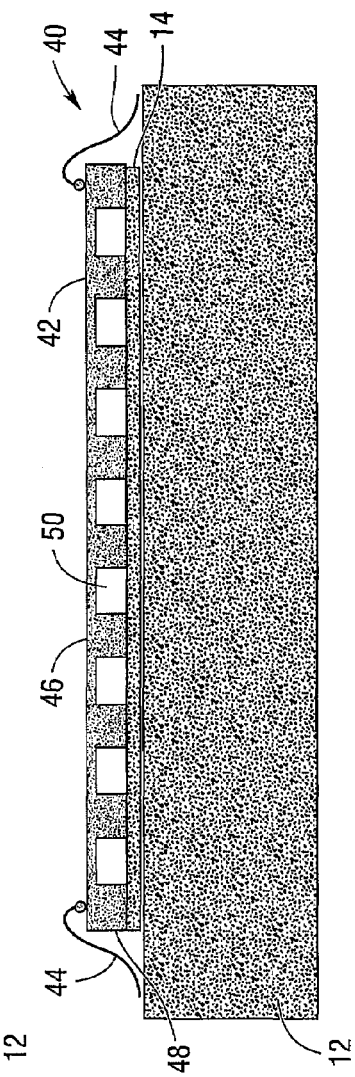

DESTRUCTOR INTEGRATED CIRCUIT CHIP, INTERPOSER ELECTRONIC DEVICE AND METHODS

BACKGROUND

Anti-tamper ("AT") protection is employed so that it is very difficult to reverse engineer or alter the function of electronic hardware (e.g., computer processors, integrated circuits, multi-chip modules, etc). For some commercial applications, designers often spend vast sums of money to develop a "next generation" circuit. These companies often wish to deter, or at least hamper a competitor's reverse engineering efforts. The motivation in this case is to protect valuable intellectual property. Military and Government users also have a strong interest in AT protection. When new military hardware is fielded, often the consequences of capture are not fully understood or considered by the designer of the hardware. Similarly, the combat loss of any one of a thousand pieces of sensitive, high-tech military hardware could do irreparable damage to national security.

Most AT is categorized as either passive or active. In each case, the intent is to delay, prevent or stop tampering and potential reverse engineering of an electronic circuit. Passive AT is currently the most widespread method of deterring an opponent from reverse engineering or spoofing an electronic circuit. Current passive AT arrangements include encapsulation and various types of conformal coatings such as epoxies. Methods to defeat common encapsulents are well documented.

AT standards have been defined according to the Federal Information Protection Standard (FIPS) 140-2. The standard describes the requirements for four levels of protection. For the standards for multi-chip, embedded modules, Level 1 calls for standard passivation techniques (i.e., a sealing coat applied over the chip circuitry to protect it against environmental or other physical damage). The standard describes that Level 2 can be achieved using anti-tamper coatings or passive AT. Level 3 may use passive AT if tampering will likely destroy the module. Level 4 requires the use of active AT technologies.

Layered anti-tamper arrangements are also employed in which alternating layers of passive AT with active AT yields a synergy in probing difficulty. With active AT methods, a protected circuit will take some action when unauthorized activities are detected. Any number of events can trigger a programmed circuit response. Examples of active triggering arrangements include: voltage, photon detection, acceleration, strain, thermal, chemical attack, and proximity or tamper-respondent enclosures. The response of an active AT circuit upon triggering is also widely variable. For example, zeroization may be employed in which critical memory cells or an entire die can be erased. Similarly, a response can trigger overwriting of some or all of a memory die.

SUMMARY

In one embodiment, the present invention is directed to a semiconductor device. The device includes a substrate and an integrated circuit chip. The device also includes an electrically reactive layer located between a top surface of the substrate and a bottom surface of the integrated circuit chip, wherein the reactive layer is positioned such that detection of tampering causes the reactive layer to be electrically energized such that the semiconductor device is at least partially destroyed.

In one embodiment, the present invention is directed to a semiconductor device. The device includes a substrate and an integrated circuit chip. The device also includes a thermally reactive layer located between a top surface of the substrate and a bottom surface of the integrated circuit chip, wherein the reactive layer is positioned such that detection of tampering causes the reactive layer to be thermally energized such that the semiconductor device is at least partially destroyed.

In one embodiment, the present invention is directed to a semiconductor device. The semiconductor device includes a substrate and an integrated circuit chip. The device also includes electrically reactive means located between a top surface of the substrate and a bottom surface of the integrated circuit chip, wherein the electrically reactive means is positioned such that detection of tampering causes the electrically reactive means to be electrically energized such that the semiconductor device is at least partially destroyed.

In one embodiment, the present invention is directed to a semiconductor device. The semiconductor device includes a substrate and an integrated circuit chip. The device also includes a thermally reactive means located between a top surface of the substrate and a bottom surface of the integrated circuit chip, wherein the thermally reactive means is positioned such that detection of tampering causes the thermally reactive means to be energized such that the semiconductor device is at least partially destroyed.

BRIEF DESCRIPTION OF THE FIGURES

FIG. 1 illustrates embodiments of a cross section of a destructor electronic device employing flip chip bonding;

FIG. 2 illustrates embodiments of a cross section of a destructor electronic device employing flip chip bonding; and FIG. 3 illustrates embodiments of a cross section of a destructor electronic device employing wire bonding.

DESCRIPTION

Various embodiments of the present invention include packages, for example, integrated circuits and multi-chip modules that include an anti-tampering feature that causes the package or a portion of the package to be damaged, deformed, and/or destroyed upon detection of tampering. In various embodiments, after tamper detection by a sensor (e.g., a passive sensor or an active sensor), an actuator such as, for example, a metal hydrate actuator, a piezoelectric actuator, a magnetostrictive actuator, a swellable polymer gel actuator, or a shape alloy memory actuator may be used to trigger or cause damage, deformation, and/or destruction of the package or a portion of the package by energizing an actuating material. In various embodiments, the actuator is a reactive material that causes damage, deformation, and/or destruction of the package or a portion of the package after detection by the sensor.

FIG. 1 illustrates embodiments of a cross section of a destructor electronic device 10 employing flip chip bonding. As seen in FIG. 1, the device 10 includes a substrate 12 (e.g., a Silicon substrate) that forms the lowest layer of the device 10. A reactive layer 14 constructed of, for example, an electrically reactive material, a thermally reactive material, a metallic, semi-metallic, or organic-based piezoelectric material, a shape memory alloy, an energetic material, Ti—Ni, Cu—Zn—Al, Cu—Al—Ni, metallic fulminate, azide, trinitrotoluene, HMX, RDX, or pentaerythritoltetranitrate is formed on an upper surface 16 of the substrate 12. An integrated circuit wafer, or die 18 is located such that the reactive layer 14 is positioned between the die 18 and the substrate 12.

The die 18 may be positioned on the substrate 12 using solder bumps 20. The solder bumps 20 are located such that they contact the edges of the die 18 and the reactive layer 14 thus does not interfere with the electrical connections (i.e., inputs and outputs) to the die 18.

An active side 22 of the die 18 is placed such that it contacts the solder bumps 20 and the reactive layer 14. In various embodiments, a top surface 24 opposite the active surface 22 of the die 18 is scored such that voids or gaps 26 are created in the top surface 24. The scoring may be done, for example, in a crosshatch pattern, a non-adventitious pattern, or any other desired pattern. In various embodiments, the die 18 is thinned during manufacture to a thickness of, about 0.005 in. to 0.010 in. Such scoring and thinning may aid in damaging, deforming, and/or destroying the die 18 when the reactive layer 14 is energized or actuated.

In operation, if tampering is detected by a sensor (not shown) located on or in communication with the device 10, a signal sent to the reactive layer 14 causes the reactive layer to be electrically activated. The resultant change in volume or shape of the reactive layer 14 causes a force to be exerted on the die 18, thus causing damage, deformation, and/or destruction of the die 18.

FIG. 2 illustrates embodiments of a cross section of a destructor electronic device 30 employing flip chip bonding. In the device 30 illustrated in FIG. 2, the inputs to a die 31 require a ball grid array of solder bumps 32. An interposer 34, such as a flexible interposer (e.g., flex circuitry, a polyimide with a thin copper foil, etc.), is located between the reactive layer 14 and the die 31. Electrical connections can thus be made without interference by the reactive layer 14. In various embodiments, the die 31 is thinned during manufacture to a thickness of about 0.005 in. to 0.010 in. In various embodiments, the die 31 is scored to include voids 36.

FIG. 3 illustrates embodiments of a cross section of a destructor electronic device 40 employing wire bonding. A die 42 is attached to the substrate 12 and electrically connected to the substrate 12 through wire bonds 68. An active side 46 of the die 42 may be placed opposite a bottom surface 48 of the die 42 such that the wire bonds 68 may be attached properly. The reactive layer 14 is located between the bottom surface 48 of the die 42 and the substrate 12. In various embodiments, the bottom surface 48 of the die 42 is scored to create voids 50. In various embodiments, the die 42 is thinned during manufacture to a thickness of, for example, 0.005 in. to 0.010 in.

It is to be understood that the figures and descriptions of embodiments of the present invention have been simplified to illustrate elements that are relevant for a clear understanding of the present invention, while eliminating, for purposes of clarity, other elements. Those of ordinary skill in the art will recognize, however, that these and other elements may be desirable for practice of various aspects of the present embodiments. However, because such elements are well known in the art, and because they do not facilitate a better understanding of the present invention, a discussion of such elements is not provided herein.

It can be appreciated that, in some embodiments of the present methods and systems disclosed herein, a single component can be replaced by multiple components, and multiple components replaced by a single component, to perform a given function or functions. Except where such substitution would not be operative to practice the present methods and systems, such substitution is within the scope of the present invention.

Examples presented herein, including operational examples, are intended to illustrate potential implementations of the present method and system embodiments. It can be appreciated that such examples are intended primarily for purposes of illustration. No particular aspect or aspects of the example method, product, computer-readable media, and/or system embodiments described herein are intended to limit the scope of the present invention.

It should be appreciated that figures presented herein are intended for illustrative purposes and are not intended as construction drawings. Omitted details and modifications or alternative embodiments are within the purview of persons of ordinary skill in the art. Furthermore, whereas particular embodiments of the invention have been described herein for the purpose of illustrating the invention and not for the purpose of limiting the same, it will be appreciated by those of ordinary skill in the art that numerous variations of the details, materials and arrangement of parts/elements/steps/functions may be made within the principle and scope of the invention without departing from the invention as described in the appended claims.

What is claimed is:

1. A semiconductor device, comprising:
    a substrate;
    an integrated circuit chip; and
    a non-ignitable electrically reactive layer located between a top surface of the substrate and a bottom surface of the integrated circuit chip, wherein the non-ignitable electrically reactive layer is positioned such that detection of tampering causes the non-ignitable electrically reactive layer to be electrically energized such that the integrated circuit chip is at least partially destroyed by the non-ignitable electrically reactive layer.

2. The semiconductor device of claim 1, wherein the non-ignitable electrically reactive layer includes a piezoelectric material.

3. The semiconductor device of claim 1, wherein the piezoelectric material is one of an organic-based piezoelectric material, a metallic piezoelectric material, and a semi-metallic piezoelectric material.

4. The semiconductor device of claim 1, wherein the integrated circuit chip includes a top surface having a plurality of voids.

5. The semiconductor device of claim 4, wherein the voids are arranged in a crosshatch pattern.

6. The semiconductor device of claim 4, wherein the voids are arranged in a non-adventitious arrangement.

7. The semiconductor device of claim 1, further comprising a flexible interposer located between the non-ignitable electrically reactive layer and the integrated circuit chip.

8. The semiconductor device of claim 7, wherein the flexible interposer includes a flexible polymeric layer and one of a metallic conductive layer and a non-metallic conductive layer.

9. The semiconductor device of claim 1, wherein the integrated circuit chip has a thickness of approximately 0.005 in. to 0.010 in.

10. The semiconductor device of claim 1, wherein the bottom surface of the integrated circuit chip is an active surface.

11. The semiconductor device of claim 1, wherein the integrated circuit chip is in electrical communication with the substrate using at least one of flip chip bonding and wire bonding.

12. A semiconductor device, comprising:
    a substrate;
    an integrated circuit chip; and
    non-ignitable electrically reactive means located between a top surface of the substrate and a bottom surface of the integrated circuit chip, wherein the non-ignitable electrically reactive means is positioned such that detection of tampering causes the non-ignitable electrically reactive means to be electrically energized such that the integrated circuit chip is at least partially destroyed by the non-ignitable electrically reactive means.

13. The semiconductor device of claim 12, wherein the non-ignitable electrically reactive means includes a piezoelectric material.

14. The semiconductor device of claim 12, wherein the integrated circuit chip includes a top surface having a plurality of voids.

15. The semiconductor device of claim 12, further comprising a flexible interposer located between the non-ignitable electrically reactive means and the integrated circuit chip.

16. The semiconductor device of claim 12, wherein the integrated circuit chip has a thickness of approximately 0.005 in. to 0.010 in.

17. The semiconductor device of claim 12, wherein the bottom surface of the integrated circuit chip is an active surface.

18. The semiconductor device of claim 12, wherein the integrated circuit chip is in electrical communication with the substrate using at least one of flip chip bonding and wire bonding.

19. A semiconductor device, comprising:
a substrate;
an integrated circuit chip; and
a non-ignitable and thermally reactive layer located between a top surface of the substrate and a bottom surface of the integrated circuit chip, wherein the non-ignitable and thermally reactive layer is positioned such that detection of tampering causes the non-ignitable and thermally reactive layer to be thermally energized such that the integrated circuit chip is at least partially destroyed by the non-ignitable and thermally reactive layer.

20. The semiconductor device of claim 19, wherein the non-ignitable and thermally reactive layer includes one of a shape memory alloy material and an energetic material.

21. The semiconductor device of claim 19, wherein the non-ignitable and thermally reactive layer includes at least one of Ti—Ni, Cu—Zn—Al and Cu—Al—Ni.

22. The semiconductor device of claim 19, wherein the integrated circuit chip includes a top surface having a plurality of voids.

23. The semiconductor device of claim 22, wherein the voids are arranged in a crosshatch pattern.

24. The semiconductor device of claim 22, wherein the voids are arranged in a non-adventitious arrangement.

25. The semiconductor device of claim 19, further comprising a flexible interposer located between the non-ignitable and thermally reactive layer and the integrated circuit chip.

26. The semiconductor device of claim 25, wherein the flexible interposer includes a flexible polymeric layer and one of a metallic conductive layer and a non-metallic conductive layer.

27. The semiconductor device of claim 19, wherein the integrated circuit chip has a thickness of approximately 0.005 in. to 0.010 in.

28. The semiconductor device of claim 19, wherein the bottom surface of the integrated circuit chip is an active surface.

29. The semiconductor device of claim 19, wherein the integrated circuit chip is in electrical communication with the substrate using at least one of flip chip bonding and wire bonding.

30. A semiconductor device, comprising:
a substrate;
an integrated circuit chip; and
non-ignitable and thermally reactive means located between a top surface of the substrate and a bottom surface of the integrated circuit chip, wherein the non-ignitable and thermally reactive means is positioned such that detection of tampering causes the non-ignitable and thermally reactive means to be energized such that the integrated circuit chip is at least partially destroyed by the non-ignitable and thermally reactive means.

31. The semiconductor device of claim 30, wherein the non-ignitable and thermally reactive means includes one of a shape memory alloy material and an energetic material.

32. The semiconductor device of claim 30, wherein the integrated circuit chip includes a top surface having a plurality of voids.

33. The semiconductor device of claim 30, further comprising a flexible interposer located between the non-ignitable and thermally reactive means and the integrated circuit chip.

34. The semiconductor device of claim 30, wherein the integrated circuit chip has a thickness of approximately 0.005 in. to 0.010 in.

35. The semiconductor device of claim 30, wherein the bottom surface of the integrated circuit chip is an active surface.

36. The semiconductor device of claim 30, wherein the integrated circuit chip is in electrical communication with the substrate using at least one of flip chip bonding and wire bonding.

37. A semiconductor device, comprising:
a substrate;
an integrated circuit chip; and
an actuating material located between a top surface of the substrate and a bottom surface of the integrated circuit chip for applying a force to the integrated circuit chip in response to detection of tampering such that the integrated circuit chip is at least partially destroyed by the force, wherein the actuating material is selected from the group consisting of: a metal hydrate actuating material, a piezoelectric actuating material, a magnetostrictive actuating material, a swellable polymer gel actuating material, a shape memory alloy actuating material, metallic fulminate, azide, trinitrotoluene, HMX, RDX, and pentaerythritoltetranitrate.

* * * * *